United States Patent [19]

Kim

[11] Patent Number: 5,652,173

[45] Date of Patent: Jul. 29, 1997

[54] MONOLITHIC MICROWAVE CIRCUIT WITH THICK CONDUCTORS

[75] Inventor: Manjin Jerome Kim, Hartsdale, N.Y.

[73] Assignee: Philips Electronics North America Corporation, New York, N.Y.

[21] Appl. No.: 647,386

[22] Filed: May 9, 1996

[51] Int. Cl.$^6$ .................................................. H01L 21/786
[52] U.S. Cl. ............................... 437/60; 437/21; 437/51
[58] Field of Search ............................... 437/21, 47, 51, 437/60, 918, 919

[56] References Cited

U.S. PATENT DOCUMENTS

| | | | |
|---|---|---|---|
| 4,418,470 | 12/1983 | Naster et al. | 437/60 |
| 4,767,724 | 8/1988 | Kim et al. | 437/194 |
| 4,789,648 | 12/1988 | Chow et al. | 437/225 |
| 5,162,258 | 11/1992 | Lemnios et al. | 437/51 |
| 5,219,787 | 6/1993 | Carey et al. | 437/187 |
| 5,376,574 | 12/1994 | Peterson | 437/60 |

FOREIGN PATENT DOCUMENTS

0496443A1  7/1992  European Pat. Off. .

OTHER PUBLICATIONS

"Electrochemical Effects on Chemical Mechanical Polishing and Corrosion Rate of Copper Films", by J.M. Steigerwald et al, Center for Integrated Electronics, RPI, Troy, New York. (No date).

"Reverse Pillar and Maskless Contact -Two Novel Recessed Metal Schemes and Their Comparisons to Conventional VLSI Metallization Schemes", by J.L. Yeh et al, AT&T Bell Laboratories, Allentown, Pennsylvania, pp. 95–100., 1988.

"A 2.45 GHz Power LD–MOSFET With Reduced Source Inductance by V–Groove Connections", by O. Ishikawa et al, Semiconductor Research Center Matsushita Electric Industrial Co., Ltd. Osaka, Japan, IEDM 1985, pp. 166–169.

"Field Theory Analysis of Slow–Wave Propagation on Silicon Based Coplanar MIS Transmission Lines", by S. Chen et al, Laboratory of Lightwave Electronics, Microwaves and Communications, pp. 1, 4–10., 1993.

"Inlaid Copper Multilevel Interconnections Using Planarization by Chemical–Mechanical Polishing" by S.P. Murarka et al, MRS Bulletin, Jun. 1993, pp. 46–51.

"Electrochemical Effects in the Chemical–Mechanical Polishing of Copper and Titanium Thin Films Used for Multilevel Interconnect Schemes", by J.S. Steigerwald et al, Center for Integrated Electronics, RPI, Troy, New York. (No date).

*Primary Examiner*—Chandra Chaudhari
*Attorney, Agent, or Firm*—Robert J. Kraus

[57] ABSTRACT

A monolithic microwave integrated circuit (MMIC) is produced by a method which forms multilevel conductive members, including thick low-loss metallic members. The low-loss metallic members are particularly useful for forming inductors and interconnecting circuit components. The MMIC is formed on a thick oxide layer of a silicon-on-insulator structure having a high-resistivity silicon substrate to inhibit RF interaction with the substrate.

23 Claims, 4 Drawing Sheets

MONOLITHIC MICROWAVE CIRCUIT WITH THICK CONDUCTORS

BACKGROUND OF THE INVENTION

1. Field of the Invention

The invention relates to a method of making a monolithic microwave integrated circuit (MMIC) with conductive members for integrated passive components.

2. Description of Related Art

The manufacture of semiconductor circuitry is a complicated process. It becomes even more complicated when monolithic microwave circuitry including one or more passive components is to be included in an MMIC. For example, each capacitor requires multilevel conductive plates, each resistor requires a layer of material having a predetermined conductivity and predetermined dimensions, and each inductor requires a high-Q metallic conductor. As used in this application, the term "conductive" is to be interpreted as including both higher conductivity materials, such as metals, and lower conductivity materials, such as doped semiconductors.

Further, to minimize electrical losses at microwave frequencies, thick metallic conductors should be used for making electrical connections to the passive components and for the inductor windings. As used in this application, the term "thick", as applied to a metallic conductor layer, is to be interpreted as meaning a layer thickness of at least two times the skin depth of the metallic conductor at the highest operational microwave frequency of signals carried by the conductor. conductor.

Known methods for forming conductive members in integrated circuits are overly complicated or are not capable of producing integrated circuits which are ideally suited for operation at microwave frequencies. For example, U.S. Pat. No. 4,789,648 discloses an apparently-simple process for producing multilevel metal/insulator films on a substrate and for forming patterned conductive lines simultaneously with connecting stud lines. However, a metal etch-stop layer utilized in the process is difficult to completely remove after the etching step is performed. This effectively prevents use of the metal etch-stop layer in areas where subsequently-deposited conductive layers are not to be electrically connected.

SUMMARY OF THE INVENTION

It is an object of the invention to provide a combination of steps and materials which are useful for effectively producing a MMIC having thick metallic conductors for forming one or more passive components and/or making electrical connections to such components.

It is another object of the invention to provide a method which readily produces a multilevel structure, including such thick metallic conductors, while enhancing performance of the MMIC by inhibiting RF interaction with a substrate on which the structure is produced.

In accordance with the invention, such a MMIC is produced by a process including the following steps:

Form at least one insulating layer on an insulating silicon substrate.

Deposit onto the at least one insulating layer a predetermined pattern of a conductive etch-stop material which is convertible to an insulating material. This pattern includes at least one area that is to remain conductive and at least one area that is to be converted to insulating material.

Deposit onto the pattern of etch-stop material, and onto any exposed areas of the at least one insulating layer, a first layer of LTO material having a thickness corresponding to the thickness of the thick metallic conductors.

Etch through the first layer of LTO material in a first sub-pattern corresponding to the at least one area that is to be converted to insulating material. This forms at least one cavity that corresponds to and exposes the at least one area.

Convert the exposed at least one area of the conductive etch-stop material to an insulating material.

Etch through the first layer of LTO material in a second sub-pattern corresponding to at least one portion of the at least one area of the conductive etch-stop material which is to remain conductive. This forms at least one cavity that corresponds to and exposes the at least one portion.

Fill the cavities corresponding to the at least one area and to the at least one portion with a metallic conductor material to form respective thick conductors.

Preferably, the silicon substrate has a resistivity greater than 100 Ohm-cm and the at least one insulating layer includes an RF isolation layer of an oxide material having a thickness greater than 2.0 μm to strongly inhibit RF interaction with the substrate.

DESCRIPTION OF THE PREFERRED EMBODIMENTS

Figure 1:
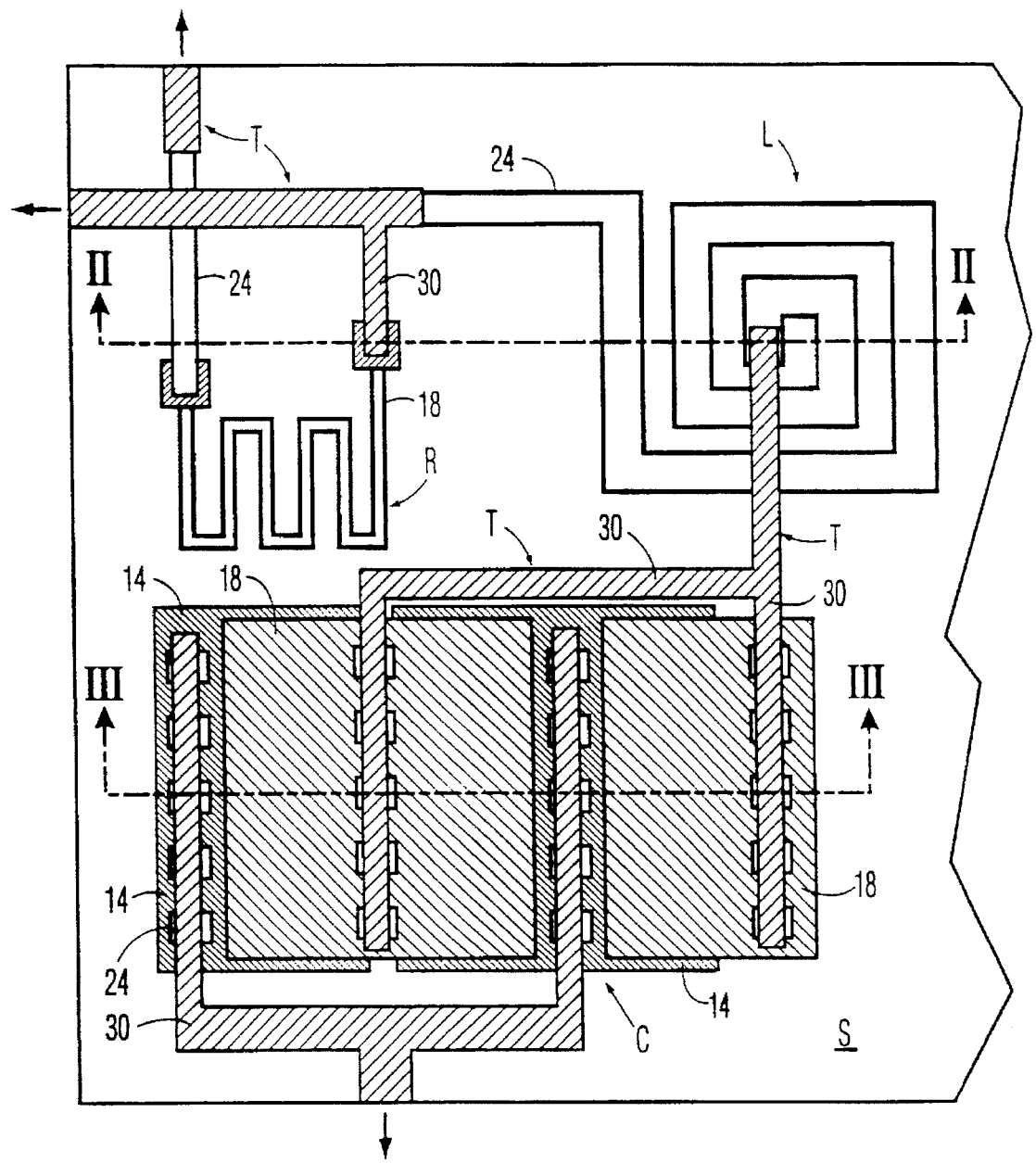
FIG. 1 is an overview of the structural members of a first arrangement of MMIC components manufactured in accordance with the invention.

FIG. 1 illustrates, from a top view, the structural members of three passive microwave components which are embedded in multilayers deposited on a substrate S. The components include a resistor R, an inductor L and a capacitor C, which are shown as if all of the other layers of the MMIC are transparent to clearly illustrate the arrangement and interconnection of the components. In this exemplary arrangement of circuit components which can be made in accordance with the invention, the resistor, inductor and capacitor are electrically connected in series by strip-type transmission lines T.

FIGS. 2, 3 and 4, illustrate successive stages in forming and interconnecting the microwave circuit components of FIG. 1 in accordance with an exemplary embodiment of the invention. More specifically:

FIGS. 2a–2e illustrate successive cross-sectional views along the line II—II of FIG. 1, showing, inter alia, the formation of portions of the resistor R and the inductor L;

FIGS. 3a–3e illustrate successive cross-sectional views along the line III—III of FIG. 1, showing, inter alia, the formation of portions of the capacitor C; and FIGS. 4a–4e illustrate successive cross-sectional views of a capacitor C', a resistor R' and an inductor L', which are formed similarly to those of FIG. 1 but are arranged side-by-side. In describing the preferred method steps in accordance with the invention, FIGS. 2, 3 and 4 will be considered together, because collectively they provide a more comprehensive illustration of the steps than would consideration of these figures separately.

Figure 2A:
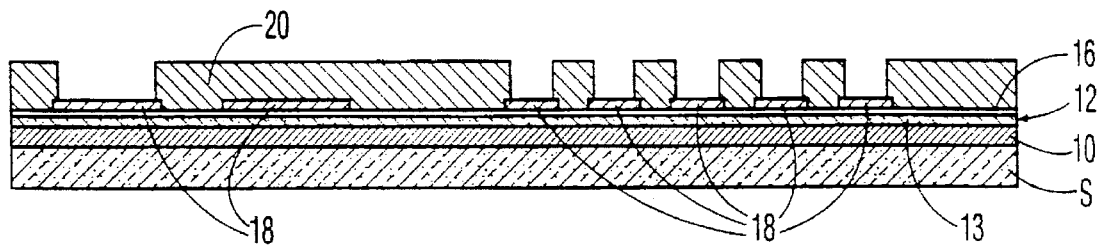
FIGS. 2a–2e are successive cross-sectional views taken along the line II—II in FIG. 1 during different stages of manufacture.
Figure 3A:
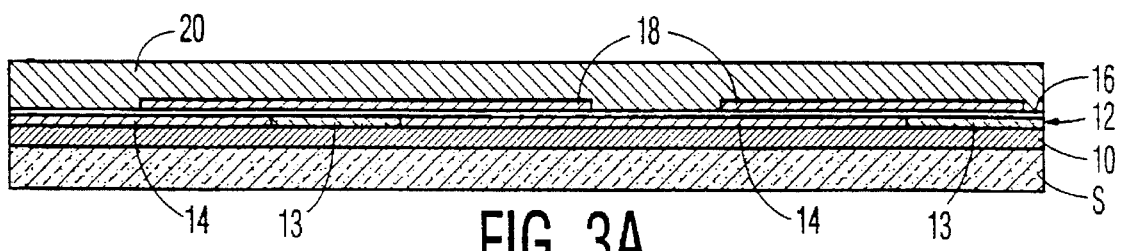
FIGS. 3a–3e are successive cross-sectional views taken along the line III—III in FIG. 1 during different stages of manufacture.
Figure 4A:
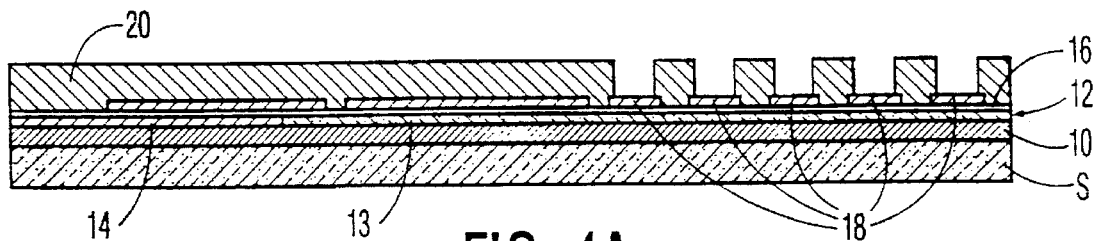
FIGS. 4a–4e are successive cross-sectional views during different stages of manufacture, in accordance with the invention, of a second arrangement of the same MMIC components as are illustrated in FIG. 1.

FIGS. 2a, 3a and 4a illustrate a first stage in the formation of the microwave circuit components, which exists after the following method steps have been performed:

A. Form a silicon-on-insulator (SOI) substrate by a bond-and-etchback method utilizing two different single-crystal silicon wafers. One of the wafers has a thin epitaxial layer with a different doping than the adjacent substrate material. The surfaces of the two wafers are then oxidized, and these silicon dioxide surfaces are thermally bonded together by heating, e.g. in a furnace.

B. Using a chemical-mechanical polishing process, grind down the wafer with the epitaxial layer almost to the epitaxial layer. The remainder of this wafer is then selectively chemically etched down to the epitaxial layer, leaving a silicon substrate S, a silicon dioxide insulating layer 10, and a silicon layer 12. Preferably the substrate S will have a resistivity greater than 100 Ohm-cm to minimize electrical losses. The oxide insulating layer 10 serves, inter alia, as an RF isolation layer and should have a thickness greater than 2.0 µm. The silicon layer 12 preferably has a thickness approximately in the range 0.2–1.5 µm for microwave applications.

C. Form at the insulating layer 10 a predetermined pattern of conductive etch-stop material which will serve, at this layer level, as conductive elements of the microwave circuit components. In this example, this is done by implanting dopant into any regions 14 of the silicon layer 12 which are to form electrodes of the capacitors C or C'. The remaining regions 13 of silicon layer 12 are converted to an insulating oxide layer by, for example, thermal oxidation. Alternatively, the pattern of etch-stop material may be formed by eliminating layer 12 and depositing metallic film electrodes directly onto the insulating layer 10. However, the silicon layer 12 may be used in active devices that might be formed elsewhere on the substrate.

D. Deposit onto the silicon layer 12, including the regions 14, an insulating layer 16, e.g. a layer of silicon dioxide having a thickness of approximately 0.05 µm. This may be done, for example, by a thermal oxidation process. Alternatively, if metallic film electrodes are used for capacitor electrodes, rather than the doped silicon regions 14, a dielectric layer may be provided on the metallic electrodes by, for example, chemical vapor deposition of an oxide such as silicon dioxide.

E. Deposit onto the insulating layer 16, e.g. by chemical vapor deposition, a predetermined pattern of a conductive etch-stop material, such as a doped polycrystalline silicon layer having a thickness of approximately 0.5 µm. This pattern is formed by shaped areas 18 of the polycrystalline silicon wherever etch stops, resistors and/or electrodes, e.g. for capacitors, are needed. Note from FIGS. 1 and 3 that in the preferred embodiment the capacitor electrodes 18 and 14 are interdigitated, with electrodes 18 collectively forming a first capacitive plate and electrodes 14 collectively forming a second capacitive plate. This facilitates the interconnection of the electrodes in each plate by metallic conductors to compensate for the lower-than-metal conductivities of the doped silicon electrodes.

F. Deposit, e.g. by chemical vapor deposition, onto the doped polycrystalline silicon areas 18 and onto the exposed insulating layer 16, or 10, a thick low-temperature oxide (LTO) layer 20, e.g. a layer of silicon oxide having a thickness greater than 3 µm, e.g. 5 µm. A suitable LTO material is one which will permit processing at temperatures below approximately 450° C.

G. Selectively etch through the LTO layer 20, in a first sub-pattern corresponding to selected ones of the areas 18, of the doped polycrystalline silicon, which need not remain conductive. In the examples illustrated by FIGS. 1–4, such areas include all those which are to form neither a resistive element nor a capacitive plate. Preferably the etching is done by a process such as anisotropic reactive ion etching. This etching step is continued until the selected areas 18 are exposed, thereby forming cavities in the LTO layer corresponding to the selected ones of the areas 18.

Figure 2B:
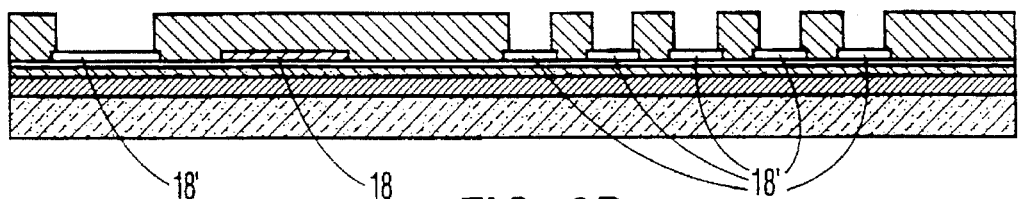
Figure 3B:
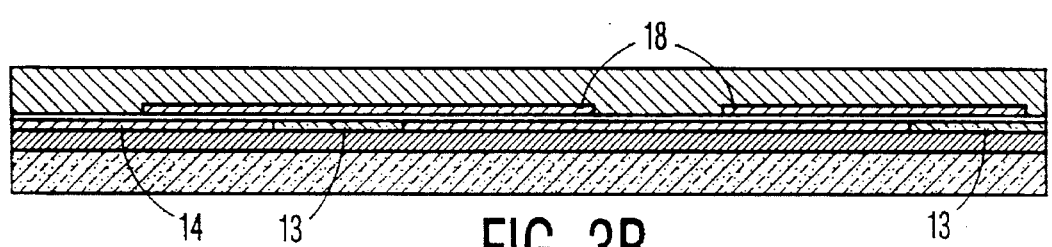
Figure 4B:
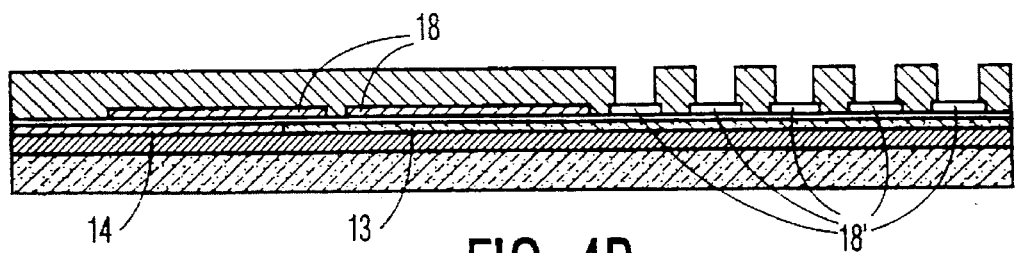

FIGS. 2b, 3b and 4b illustrate a second stage in the formation of the microwave circuit components, which exists after the following additional method step has been performed:

H. Oxidize, e.g. by thermal oxidation, the exposed ones of the areas 18 of etch-stop material to convert them to insulating areas 18'. Note that this step is done to ensure that any closely-spaced areas 18 which need not remain conductive are not electrically shorted together. For example, if any of the areas 18 that will underlie the inductor L happened to contact each other, the conversion of these areas to an insulating material 18' will prevent shorting of adjacent turns of the thick conductive material that will form the conductor. If there are no such closely-spaced areas, this oxidation step may be eliminated and etching steps G and I may be performed as a single step.

Figure 2C:
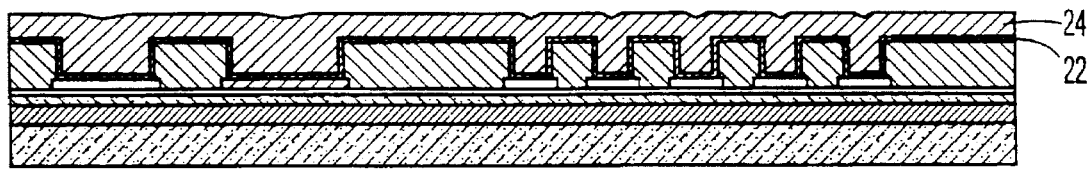
Figure 3C:
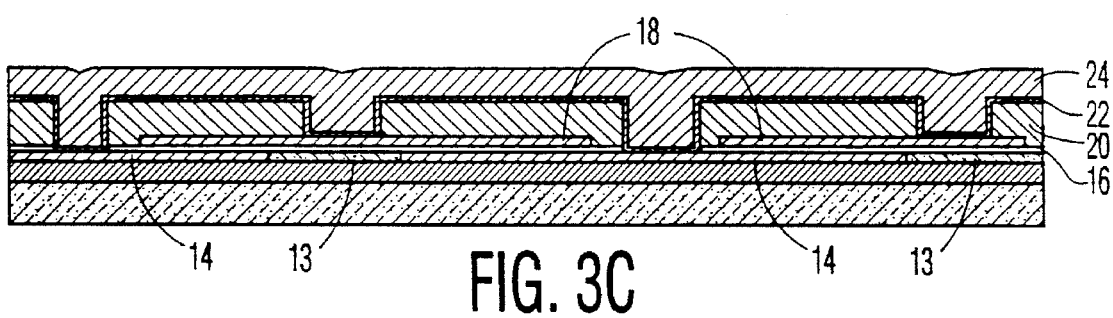
Figure 4C:
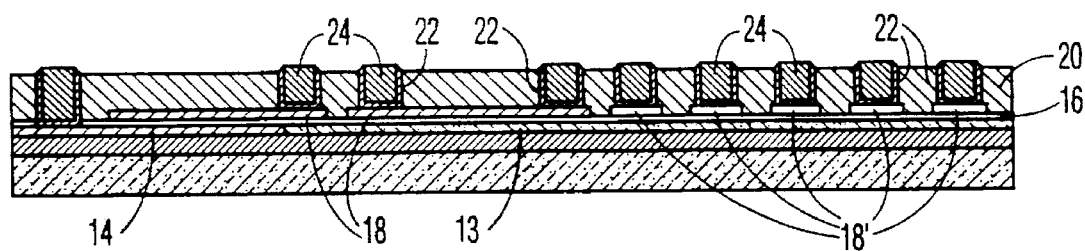

FIGS. 2c, 3c and 4c illustrate a third stage in the formation of the microwave circuit components, which exists after the following additional method steps have been performed:

I. Selectively etch through the LTO layer 20, and the insulating layer 16, in a second sub-pattern corresponding to portions of the remaining areas 18, and of the areas 14, to which electrical connections are to be made via thick metallic conductors. Again, the etching is done preferably by a process such as anisotropic reactive ion etching. This etching step is continued until the remaining areas 18, and areas 14, are exposed, thereby forming cavities in the LTO layer corresponding to locations where these thick metallic conductors are to be formed.

J. Deposit a thin adhesion layer 22, such as an approximately 1000 Å thick layer of titanium. This layer will provide an adhesion surface for the thick metallic conductor to be applied and will act as a barrier against diffusion of the metallic conductor, e.g. copper, into adjacent oxide materials. In FIGS. 2C and 3C, the layer 22 is applied, by a process such as sputtering, onto all exposed surfaces of the LTO and onto the exposed surface areas 14, 18 and 18'. FIG. 4C shows an alternative step in which the thin titanium adhesion layer is selectively deposited, by a process such as sputtering in combination with sputter etching, onto the cavity walls and onto the exposed surface areas 14, 18 and 18'.

K. Deposit onto the adhesion layer 22, such as by chemical vapor deposition, a thick metallic layer 24, such as copper. This deposition step is continued until the thick metallic layer fills the cavities in the LTO. A conformal chemical vapor deposition process, as is illustrated in FIGS. 2c and 3c, is preferred, because of its simplicity. If this type of process is used, the metallic deposition simply continues until the cavities in the LTO are filled and its surface is covered over the adhesion layer 22. Alternatively, a selective chemical vapor deposition process, as is illustrated in FIG. 4c, may be used. In this process the metallic material is selectively deposited into the cavities and onto the adhesion material 22 in the cavities.

Figure 2D:
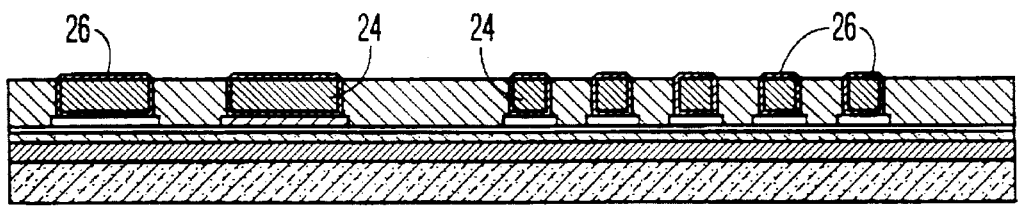
Figure 3D:
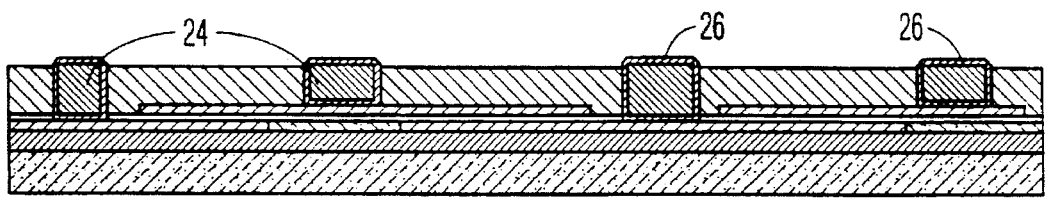
Figure 4D:
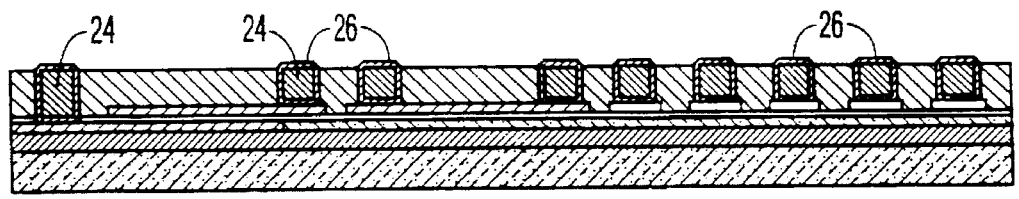

FIGS. 2d, 3d and 4d illustrate a fourth stage in the formation of the microwave circuit components, which exists after the following additional method steps have been performed:

L. Remove any metallic material 24 deposited on the upper surface of the LTO layer 20. As is illustrated in FIG. 4c, no such material should exist if a selective chemical vapor deposition process has been used. However, if the conformal chemical vapor deposition process has been used, as in FIGS. 2c and 3c, the metallic deposition on the upper surface of the LTO layer can be removed by a method such as chemical-mechanical polishing. Such polishing methods are described, for example, by S. P. Murarka et al. in Inlaid Copper Multilevel Interconnections Using Planarization by Chemical-Mechanical Polishing, Material Research Society Bulletin, June 1993; and by J. M. Steigerwald et al. in Electrochemical Effects on Chemical Mechanical Polishing and Corrosion Rate of Copper Films, Material Research Society Bulletin, June 1993.

M. Selectively deposit a passivation layer 26 onto the exposed surface areas of the thick metallic layer 24. This may be done, for example, by making a selective reaction of the metallic layer 24 with a silicon compound such as $SiH_4$.

Figure 2E:
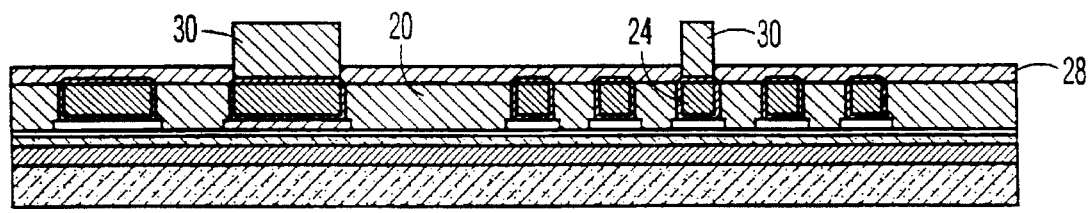
Figure 3E:
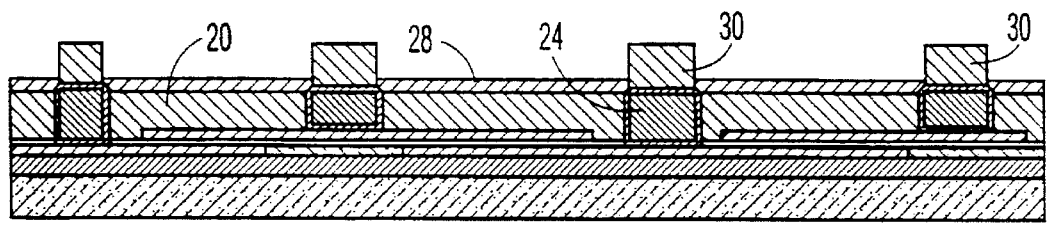
Figure 4E:
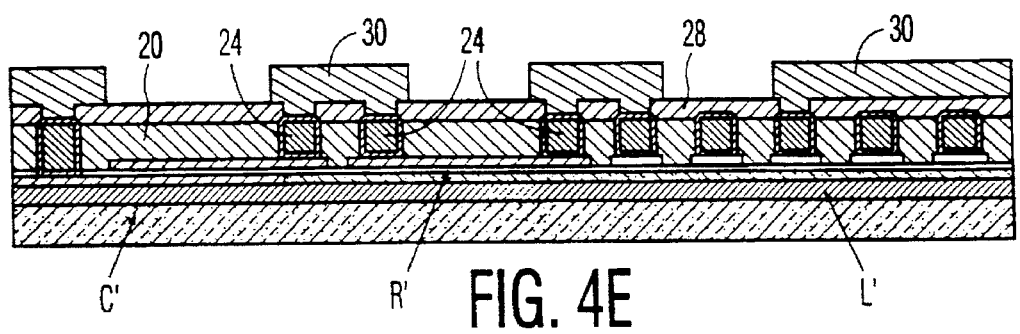

FIGS. 2e, 3e and 4e illustrate a fifth stage in the formation of the microwave circuit components, which exists after the following additional method steps have been performed:

N. Deposit onto the areas of the first LTO layer 20 and the passivation layer 26 a second LTO layer 28 having a thickness of approximately 0.3 μm.

O. Selectively etch through the LTO layer 28, e.g. by a conventional photolithographic exposure and etching process, in a pattern corresponding to areas where electrical contact is to be made to the thick metallic layer 24.

P. Deposit a metallic layer 30 in a pattern corresponding to conductive tracks, such as the strip-type transmission lines T of FIG. 1, which are to make electrical contact with exposed areas of the thick metallic layer 24. This is done by a conventional photolithographic exposure and etching process such as sputtering, photo exposure, and reactive ion etching. Preferably the metallic layer 30 comprises a material such as aluminum and has a thickness which is relatively small in comparison to the layer 24, e.g. 1.5 to 5.0. Aluminum alloys, such as Al—Cu and Al—Cu—Si may also be used, particularly if electromigration or aluminum spiking become problems.

I claim:

1. A method of making a monolithic microwave integrated circuit including thick metallic conductors, said method comprising the steps of:

a. forming at least one insulating layer onto an insulating silicon substrate;
   b. depositing onto the at least one insulating layer a predetermined pattern of a conductive etch-stop material which is convertible to an insulating material, said pattern including at least one area that is to remain conductive and at least one area that is to be converted to insulating material;
   c. depositing onto the pattern of etch-stop material, and onto any exposed areas of the at least one insulating layer, a first layer of low-temperature oxide material having a thickness corresponding to the thickness of the thick metallic conductors;
   d. etching through the first layer of LTO material in a first sub-pattern corresponding to the at least one area that is to be converted to insulating material to form at least one cavity that corresponds to and exposes the at least one area;
   e. converting the exposed at least one area of the conductive etch-stop material to an insulating material;
   f. etching through the first layer of LTO material in a second sub-pattern corresponding to at least one portion of the at least one area of the conductive etch-stop material which is to remain conductive to form at least one cavity that corresponds to and exposes the at least one portion; and
   g. filling the cavities corresponding to the at least one area and to the at least one portion with a metallic conductor material forming respective thick conductors.

2. A method of making a monolithic microwave integrated circuit including thick metallic conductors, said method comprising the steps of:

a. forming a silicon-on-insulator layer structure on an insulating silicon substrate;
   b. doping the silicon layer, in at least one predetermined area, to form a layer of a conductive material;
   c. depositing an insulating layer onto at least the conductive material;
   d. depositing onto the insulating layer, in a predetermined pattern of areas, a layer of a conductive etch-stop material which is convertible to an insulating material, said pattern including at least one area which is to remain conductive and at least one area which is to be converted to insulating material;
   e. depositing onto the layer of conductive etch-stop material, and onto any exposed areas of the insulating layer, a first layer of LTO material having a thickness corresponding to the thickness of the thick metallic conductors;
   f. etching through the first layer of LTO material, in a first sub-pattern corresponding to the at least one area of the conductive etch-stop material which is to be converted to said insulating material, to expose said at least one area and to form at least one cavity in the LTO material corresponding to said at least one area;
   g. converting the exposed at least one area of the conductive etch-stop material to an insulating material;
   h. etching through the first layer of LTO material, in a second sub-pattern corresponding to at least one portion of the at least one area of the conductive etch-stop material which is to remain conductive, to expose said portion and to form at least one cavity in the LTO material corresponding to said portion; p1 i. depositing an adhesion layer onto walls defining the cavities formed in the layer of LTO material and onto the exposed at least one portion;

j. filling the cavities corresponding to the at least one area and to the at least one portion with a metallic conductor material for adhering to the thin adhesion layer and forming respective thick conductors.

3. A method as in claim 1 or 2 including the steps of:

a. selectively depositing a conductive passivation layer onto exposed portions of the thick conductors;

b. depositing a second layer of LTO material onto the passivation layer and onto exposed areas of the first layer of LTO material;

c. selectively etching through the second layer of LTO material to expose at least one area of the passivation layer via which electrical contact is to be made with a respective one of the thick conductors;

d. selectively depositing a conductive layer onto the exposed at least one area of the passivation layer to make said electrical contact.

4. A method as in claim 1 or 2 where the insulating silicon substrate has a resistivity greater than 100 Ohm-cm.

5. A method as in claim 1 or 2 where the insulating layer comprises an isolation oxide layer having a thickness greater than 2.0 µm.

6. A method as in claim 1 or 2 where the etch-stop material comprises polycrystalline silicon.

7. A method as in claim 1 or 2 where the conductive etch-stop material comprises doped polycrystalline silicon.

8. A method as in claim 7 where the conductive etch-stop material is converted to an insulating material by oxidation.

9. A method as in claim 1 or 2 where the first layer of LTO material has a thickness which is greater than 3 µm.

10. A method as in claim 1 or 2 where the metallic conductor material forming the thick conductors comprises copper.

11. A method as in claim 2 where the adhesion layer comprises a metallic material.

12. A method as in claim 11 where the adhesion layer comprises titanium.

13. A method as in claim 2 where the adhesion layer is substantially thinner than the second insulating layer.

14. A method as in claim 13 where the adhesion layer has a thickness of approximately 1000 Å.

15. A method as in claim 3 where the conductive passivation layer is selectively deposited onto the exposed portions of the thick conductors by reaction with a silicon compound.

16. A method as in claim 15 where the silicon compound comprises $SiH_4$.

17. A method as in claim 3 where the selectively deposited conductive layer comprises a metallic material.

18. A method as in claim 17 where the selectively deposited conductive layer comprises aluminum.

19. A method as in claim 1 or 2 where at least one area of the etch-stop material which is to remain conductive comprises an electrode.

20. A method as in claim 19 where the electrode comprises an element of a capacitor.

21. A method as in claim 1 or 2 where at least one area of the etch-stop material which is to remain conductive comprises a resistor.

22. A method as in claim 1 or 2 where at least one of the thick conductors comprises an inductor.

23. A method as in claim 22 where the at least one thick conductor forms a winding of an inductor.

* * * * *